United States Patent
Yen et al.

(10) Patent No.: US 11,462,455 B2
(45) Date of Patent: Oct. 4, 2022

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Shiu-Fang Yen, Kaohsiung (TW); Chang-Lin Yeh, Kaohsiung (TW); Jen-Chieh Kao, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 423 days.

(21) Appl. No.: 16/262,762

(22) Filed: Jan. 30, 2019

(65) Prior Publication Data

US 2019/0393126 A1    Dec. 26, 2019

Related U.S. Application Data

(60) Provisional application No. 62/688,920, filed on Jun. 22, 2018.

(51) Int. Cl.
*H01L 21/00* (2006.01)
*H01L 23/367* (2006.01)
(Continued)

(52) U.S. Cl.
CPC ...... *H01L 23/3675* (2013.01); *H01L 21/4853* (2013.01); *H01L 21/4871* (2013.01); *H01L 21/565* (2013.01); *H01L 23/3128* (2013.01); *H01L 23/3737* (2013.01); *H01L 23/49838* (2013.01); *H01L 23/562* (2013.01); *H01L 23/66* (2013.01); *H01L 24/16* (2013.01); *H01L 24/73* (2013.01); *H01L 25/0652* (2013.01); *H01Q 1/38* (2013.01); *H01L 2223/6677* (2013.01); *H01L 2224/16157* (2013.01); *H01L 2224/73265* (2013.01); *H01L 2225/06517* (2013.01);
(Continued)

(58) Field of Classification Search
CPC ............ H01L 23/3675; H01L 21/4853; H01L 21/4871; H01L 21/565; H01L 23/3128; H01L 23/3737; H01L 23/49838; H01L 23/562; H01L 23/66; H01L 24/16; H01L 24/73; H01L 25/0652; H01L 2223/6677; H01L 2224/16157; H01L 2224/73265; H01L 2225/06517; H01L 2225/06558; H01L 2225/06572; H01L 2225/06586; H01L 2225/06589; H01L 2924/35121; H01Q 1/38
See application file for complete search history.

(56) References Cited

U.S. PATENT DOCUMENTS 9,293,446 B2    3/2016  Matsumoto et al.
10,157,887 B2 *  12/2018  Chen ........................ H01L 23/24

OTHER PUBLICATIONS

U.S. Appl. No. 15/691,455, filed Aug. 30, 2017, Hu, Ian.

* cited by examiner

*Primary Examiner* — Richard A Booth
(74) *Attorney, Agent, or Firm* — Foley & Lardner LLP

(57) ABSTRACT

A semiconductor package device includes a substrate, an electronic component, and a thermal conductive layer. The electronic component is disposed on the substrate and includes a first surface facing away from the substrate. The thermal conductive layer is disposed above the first surface of the electronic component. The thermal conductive layer includes a plurality of portions spaced apart from each other.

17 Claims, 22 Drawing Sheets

(51) Int. Cl.
  *H01L 23/00* (2006.01)
  *H01L 23/31* (2006.01)
  *H01L 23/373* (2006.01)
  *H01L 23/498* (2006.01)
  *H01L 23/66* (2006.01)
  *H01L 21/48* (2006.01)
  *H01L 21/56* (2006.01)
  *H01Q 1/38* (2006.01)
  *H01L 25/065* (2006.01)

(52) U.S. Cl.
  CPC ............... *H01L 2225/06558* (2013.01); *H01L 2225/06572* (2013.01); *H01L 2225/06586* (2013.01); *H01L 2225/06589* (2013.01); *H01L 2924/35121* (2013.01)

SEMICONDUCTOR PACKAGE DEVICE AND METHOD OF MANUFACTURING THE SAME

CROSS-REFERENCE TO RELATED APPLICATION

This application claims the benefit of and priority to U.S. Provisional Application No. 62/688,920, filed Jun. 22, 2018, the contents of which are incorporated herein by reference in their entirety.

BACKGROUND

1. Technical Field

The present disclosure relates generally to a semiconductor package device, and more particularly, the present disclosure relates to a semiconductor package device including a thermal conductive layer and a method of manufacturing the same.

2. Description of the Related Art

A thermal interface material (TIM) is used between a semiconductor package device and a main board (or a mother board) to dissipate heat generated by the semiconductor package device, in which the semiconductor package device and the main board are connected by input/output (I/O) connection elements such as solder balls, and the TIM is connected to a thermal dissipation structure of the main board. However, alignment between the TIM and the thermal dissipation structure of the main board and height consistency between the TIM and the I/O connection elements may be difficult to achieve. Further, delamination between the TIM and the main board may occur due to coefficient of thermal expansion (CTE) mismatch during temperature cycles of various manufacturing processes.

SUMMARY

In one aspect, according to some embodiments, a semiconductor package device includes a substrate, an electronic component, and a thermal conductive layer. The electronic component is disposed on the substrate and includes a first surface facing away from the substrate. The thermal conductive layer is disposed above the first surface of the electronic component. The thermal conductive layer includes a plurality of portions spaced apart from each other.

In another aspect, according to some embodiments, an electrical device includes a main board, a package device and a thermal conductive material. The package device is disposed on the main board and includes a substrate, a first electronic component, and a thermal conductive layer. The substrate includes a first surface and a second surface opposite the first surface. The first electronic component is disposed on the first surface of the substrate and includes a first surface facing toward the main board and a second surface facing toward the substrate. The thermal conductive layer is disposed above the first surface of the first electronic component. The thermal conductive layer includes a plurality of portions spaced apart from each other. The thermal conductive material connects the main board to the package device.

In yet another aspect, according to some embodiments, a method of manufacturing an electrical device includes forming a thermal conductive layer on an electronic component, providing a main board, providing a plurality of flowable thermal conductive materials between the thermal conductive layer and the main board; and connecting the thermal conductive layer to the main board by the flowable thermal conductive materials. The flowable thermal conductive materials form a non-signal transmission region.

BRIEF DESCRIPTION OF THE DRAWINGS

Aspects of the present disclosure are best understood from the following detailed description when read with the accompanying drawings. It is noted that various features may not be drawn to scale, and, in the drawings, the dimensions of the depicted features may be arbitrarily increased or reduced for clarity of discussion.

Common reference numerals are used throughout the drawings and the detailed description to indicate the same or similar elements. The present disclosure will be more readily understood from the following detailed description taken in conjunction with the accompanying drawings.

DETAILED DESCRIPTION

According to some embodiments of the present disclosure, by way of a thermal conductive layer comprising a plurality of partitioned (or separated) portions and provided between a semiconductor package device and a main board, alignment between the thermal conductive layer and a thermal dissipation structure of the main board can be improved, and height consistency between the thermal conductive layer and other I/O connections connecting the main board and the semiconductor package device can also be improved. Further, delamination between the semiconductor package device and the main board can be reduced or prevented due to enhanced structural strength.

Figure 1A:
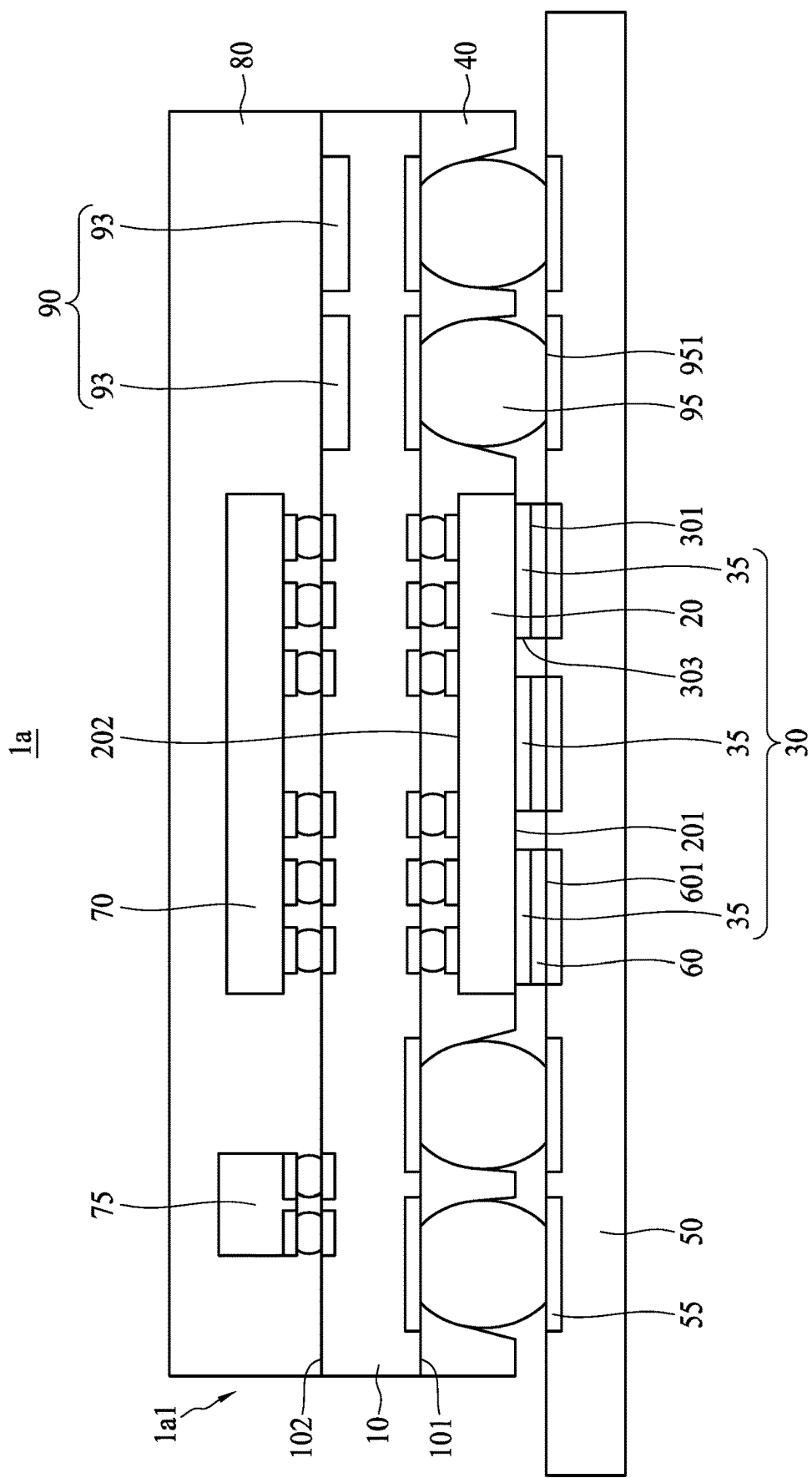
FIG. 1A illustrates a cross-sectional view of an electrical device in accordance with some embodiments of the present disclosure.

FIG. 1A illustrates a cross-sectional view of an electrical device 1a in accordance with some embodiments of the present disclosure.

The electrical device 1a includes a semiconductor package device 1a1, a main board 50 and a thermal conductive material 60. The semiconductor package device 1a1 is disposed on the main board 50 and is connected with the main board 50 by the thermal conductive material 60 and connection elements 95.

The semiconductor package device 1a1 includes a substrate 10, electronic components 20, 70 and 75, a thermal conductive layer 30, encapsulants 40 and 80, an antenna device 90 and connection elements 95.

The substrate 10 includes a surface 101 and a surface 102 opposite to the surface 101. The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element.

The electronic component 20 is disposed on the surface 101 of the substrate 10, and includes a surface 201 and a surface 202 opposite to the surface 201. The surface 201 faces toward the main board 50 or away from the substrate 10. The surface 202 faces toward the substrate 10. In some embodiments, the surface 202 may be an active surface with circuits disposed thereon for signal transmission (e.g., between the electronic component 20 and the substrate 10), and the surface 201 may be a backside surface. In the embodiment shown in FIG. 1A, the surface 201 of the electronic component 20 is exposed from the encapsulant 40.

The electronic component 20 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The thermal conductive layer 30 is disposed in the vicinity of the surface 201 of the electronic component 20, for example, the thermal conductive layer 30 is disposed on or above the surface 201 of the electronic component 20. In the embodiment shown in FIG. 1A, the thermal conductive layer 30 contacts the surface 201 of the electronic component 20. The thermal conductive layer 30 includes a plurality of portions 35 spaced apart from each other. The portions 35 of the thermal conductive layer 30 may be electrically insulated from each other. In some embodiments, the thermal conductive layer 30 includes an epoxy and/or a thermal conductive filler. In some embodiments, the thermal conductive layer 30 includes metal, for example, the portions 35 may include metal lands. A portion 35 may include laminated layers of different materials such as titanium (Ti), tantalum (Ta), chromium (Cr), copper (Cu), nickel (Ni), gold (Au) and silver (Ag). For example, a portion 35 may include a layer of Ti, Ta or Cr and layers of Cu, Ni and/or Au laminated together. In some embodiments, a portion 35 may be or may include Cu paste and/or Au paste. In some embodiments, the thermal conductive layer 30 includes material that is suitable for solder wetting.

The encapsulant 40 is disposed on or covers the surface 101 of the substrate 10. The encapsulant 40 covers, encapsulates or surrounds the electronic component 20 and the connection elements 95. The encapsulant 40 exposes a portion of each of the connection elements 95 for electrical connection. The encapsulant 40 may include an epoxy resin having fillers, a molding compound (e.g., an epoxy molding compound or other molding compound), a polyimide, a phenolic compound or material, a material with a silicone dispersed therein, or a combination thereof.

The electronic components 70 and 75 are disposed on the surface 102 of the substrate 10. The electronic components 70 and/or 75 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The encapsulant 80 is disposed on or covers the surface 102 of the substrate 10. The encapsulant 80 covers, encapsulates or surrounds the electronic components 70 and 75. The encapsulant 80 may include an epoxy resin having fillers, a molding compound (e.g., an epoxy molding compound or other molding compound), a polyimide, a phenolic compound or material, a material with a silicone dispersed therein, or a combination thereof.

The antenna device 90 is disposed in the vicinity of the surface 102 of the substrate 10, for example, the antenna device 90 is disposed on the surface 102 of the substrate 10. In the embodiment shown in FIG. 1A, the antenna device 90 includes an antenna pattern including a plurality of portions 93.

The connection elements 95 are disposed on the surface 101 of the substrate 10, and are surrounded or encapsulated by the encapsulant 40. In the embodiment shown in FIG. 1A, each connection element 95 has a portion exposed from the encapsulant 40 and connected to a pad 55 of the main board 50. The connection elements 95 may include solder balls. In some embodiments, the connection elements 95 may function as I/O connection elements between the semiconductor package device 1a1 and the main board 50 for signal transmission. For example, the connection elements 95 may be part of a substrate interposer including circuits and pads on a surface. In some embodiments, the connection elements 95 may be or may include a through mold via (TMV) filled with a conductive material. In some embodiments, the connection elements 95 may be or may include a conductive pillar which may be formed by, for example, plating to form a pillar, and molding or encapsulating the pillar with the pillar exposed.

The main board 50 may include, for example, a printed circuit board, such as a paper-based copper foil laminate, a composite copper foil laminate, or a polymer-impregnated glass-fiber-based copper foil laminate. The main board 50 may include an interconnection structure, such as a redistribution layer (RDL) or a grounding element.

The thermal conductive material 60 is disposed between the semiconductor package device 1a1 and the main board 50. As shown in FIG. 1A, the thermal conductive material 60 is disposed between the thermal conductive layer 30 of the semiconductor package device 1a1 and the pad 55 of the main board 50. The thermal conductive material 60 contacts a surface 301 of the thermal conductive layer 30. In some embodiments, a lateral surface 303 of the thermal conductive layer 30 may be exposed from the electronic component 20 or the encapsulant 40 and may be in contact with or covered by the thermal conductive material 60. The thermal conductive material 60 may include solder. In some embodiments, a surface 601 of the thermal conductive material 60 is coplanar with a surface 951 of the connection elements 95.

In some embodiments, the thermal conductive layer 30 which includes a plurality of partitioned or separated portions 35 may improve or facilitate an alignment between the thermal conductive layer 30 (or the semiconductor package device 1a1) and the thermal conductive material 60 (which is a thermal dissipation structure) of the main board 50 when mounting the semiconductor package device 1a1 on the main board 50. Further, height consistency or height control between the thermal conductive layer 30 (or the thermal conductive material 60) and the connection elements 95 can also be improved, which may prevent or reduce delamination between the semiconductor package device 1a1 and the main board 50. In some embodiments, separated portions 35 of the thermal conductive layer 30 may prevent heat aggregation or heat concentration and improve reliability. In the case where the thermal conductive layer 30 is a single piece, coefficient of thermal expansion (CTE) mismatch between the thermal conductive layer 30, the thermal material 60 and/or the main board 50 may result in misalignment or height inconsistency. In some embodiments, a single-piece thermal conductive layer 30 may result in relatively large area of wetting between the connection element 60 (which may be a single piece) and the thermal conductive layer 30 during, e.g., a reflow process. The large area of wetting may cause package tilt/warpage/incline such that a gap between one or more connection elements 95 and the main board 50 may be too far for the connection elements 95 and the main board 50 to be connected, which may cause functional failures.

Figure 1B:
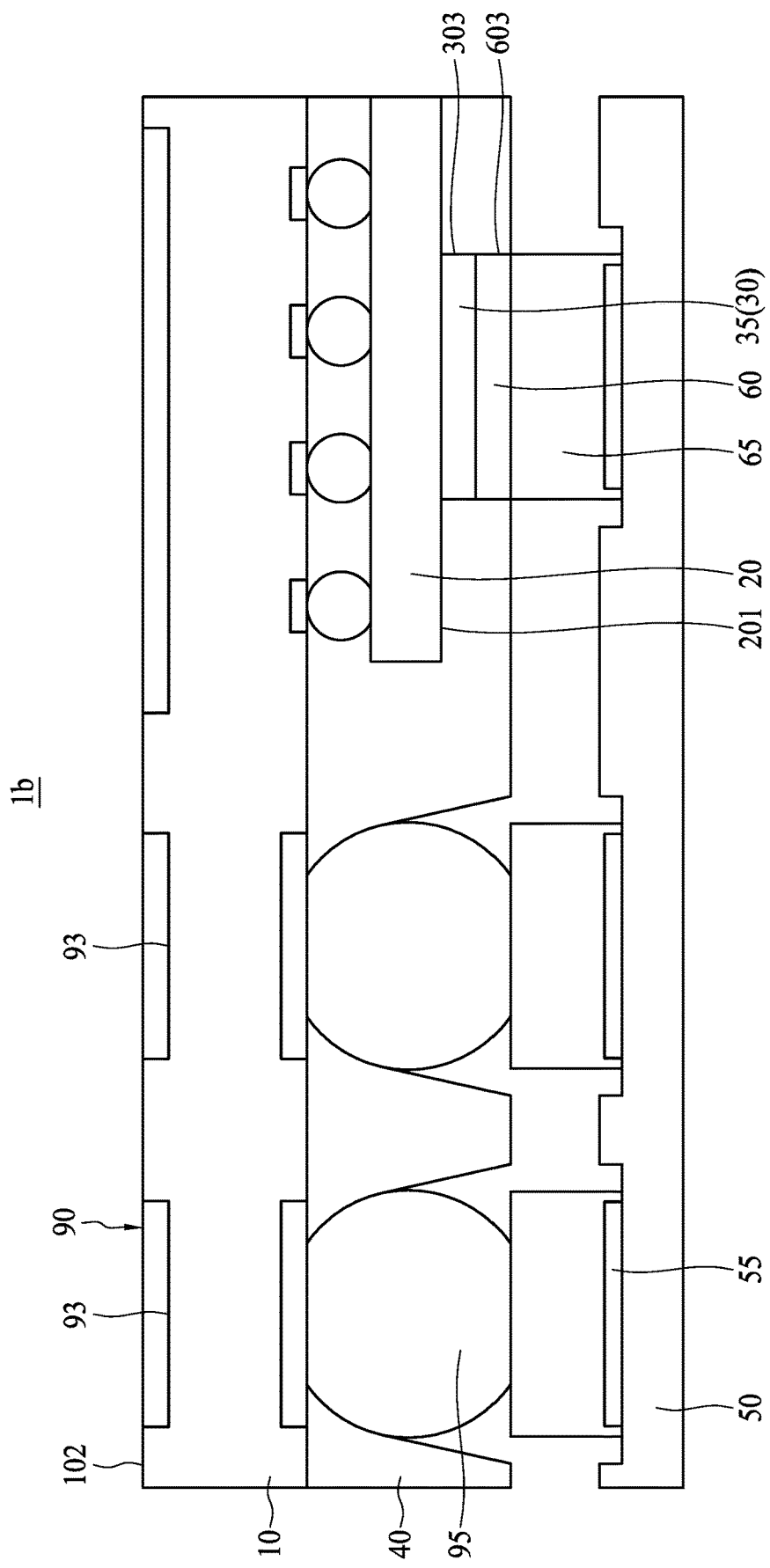
FIG. 1B illustrates a cross-sectional view of a portion of an electrical device in accordance with some embodiments of the present disclosure.

FIG. 1B illustrates a cross-sectional view of a portion of an electrical device 1b in accordance with some embodiments of the present disclosure. The electrical device 1b may be the same as or similar to the electrical device 1a in FIG. 1A with some differences described below.

The surface 201 of the electronic component 20 and a lateral surface 303 of a portion 35 of the thermal conductive layer 30 are covered or encapsulated by the encapsulant 40. A portion 35 of the thermal conductive layer 30 may include epoxy, which may improve the adhesion between the portion 35 and the encapsulant 40 (which may also include epoxy) or between the portion 35 and the electronic component 20. A lateral surface 603 of the thermal conductive material 60 may be partially covered by the encapsulant 40. Connection elements 65 are disposed between the connection elements 95 and the main board 50 and between the thermal conductive material 60 and the main board 50. The connection elements 65 may have similar properties as the connection elements 95 or the thermal conductive material 60, and may include solder. As shown in FIG. 1B, an antenna device 90 including a plurality of portions (or traces) 93 is disposed in the vicinity of a surface 102 of the substrate 10.

In some embodiments, the encapulant 40 may expose a portion of the lateral surface 303 of a portion 35 of the thermal conductive layer 30 or a portion of the lateral surface 603 of the thermal conductive material 60. The exposed portion of the lateral surface 303 and/or the lateral surface 603 may be wetted or in contact with the connection element 65. Control of the amount of the exposed portion of the lateral surface 303 and/or the lateral surface 603 may prevent bridge between adjacent connection elements 65.

Figure 1C:
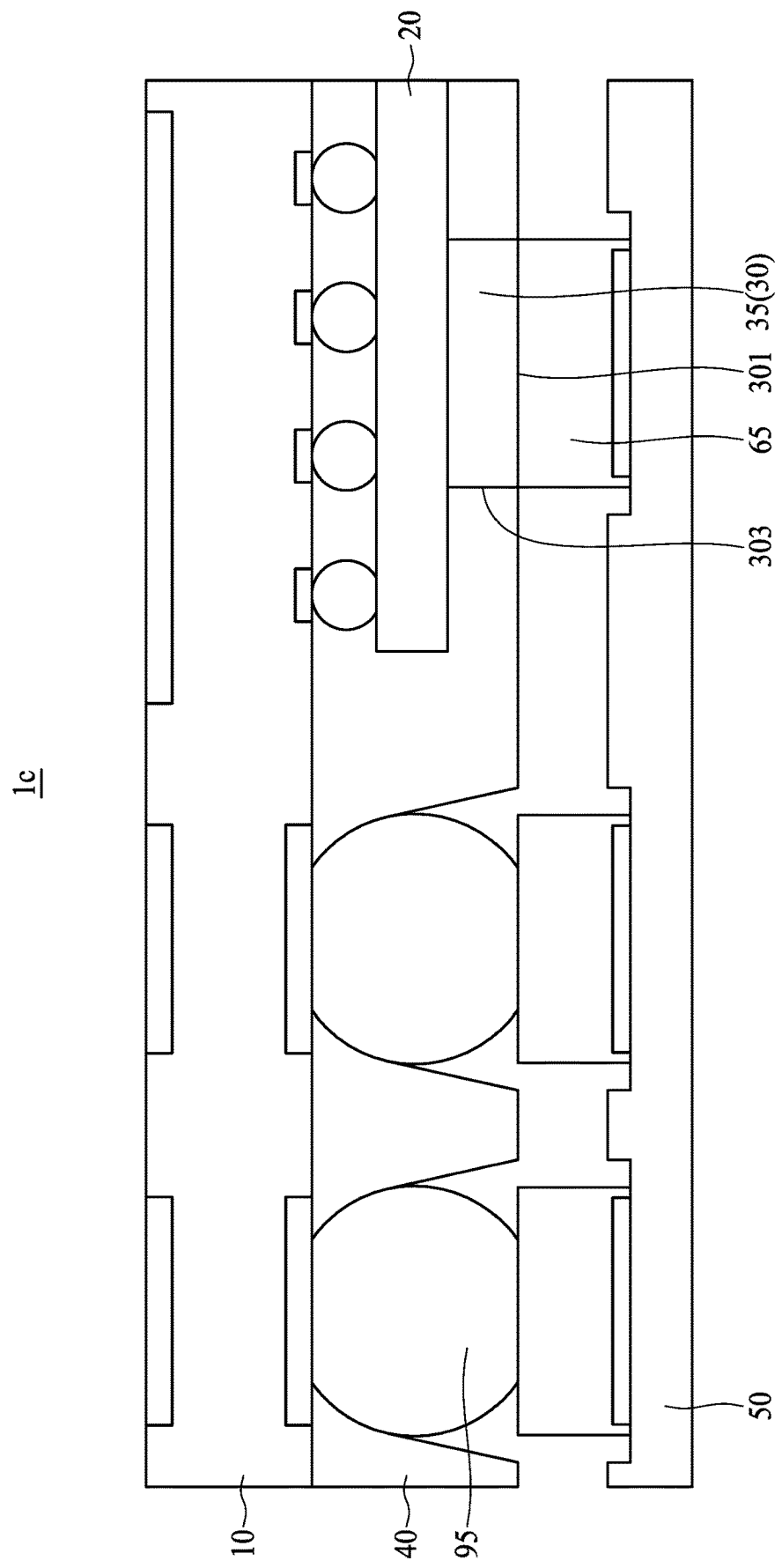
FIG. 1C illustrates a cross-sectional view of a portion of an electrical device in accordance with some embodiments of the present disclosure.

FIG. 1C illustrates a cross-sectional view of a portion of an electrical device 1c in accordance with some embodiments of the present disclosure. The electrical device 1c may be the same as or similar to the electrical device 1b in FIG. 1B with some differences described below.

A portion of a lateral surface 303 and a surface 301 of the portion 35 of the conductive layer 30 are exposed from the encapsulant 40. The conductive material 60 of the electrical device 1b in FIG. 1B is omitted in FIG. 1C. The connection element 65 is in contact with the surface 301 of the conductive layer 30. In some embodiments, the connection element 65 may be in contact with or cover the exposed portion of the lateral surface 303 of the conductive layer 30.

In some embodiments, the encapulant 40 may expose a portion of the lateral surface 303 of a portion 35 of the thermal conductive layer 30. The exposed portion of the lateral surface 303 may be wetted or in contact with the connection element 65. Control of the amount of the exposed portion of the lateral surface 303 may prevent bridge between adjacent connection elements 65.

Figure 1D:
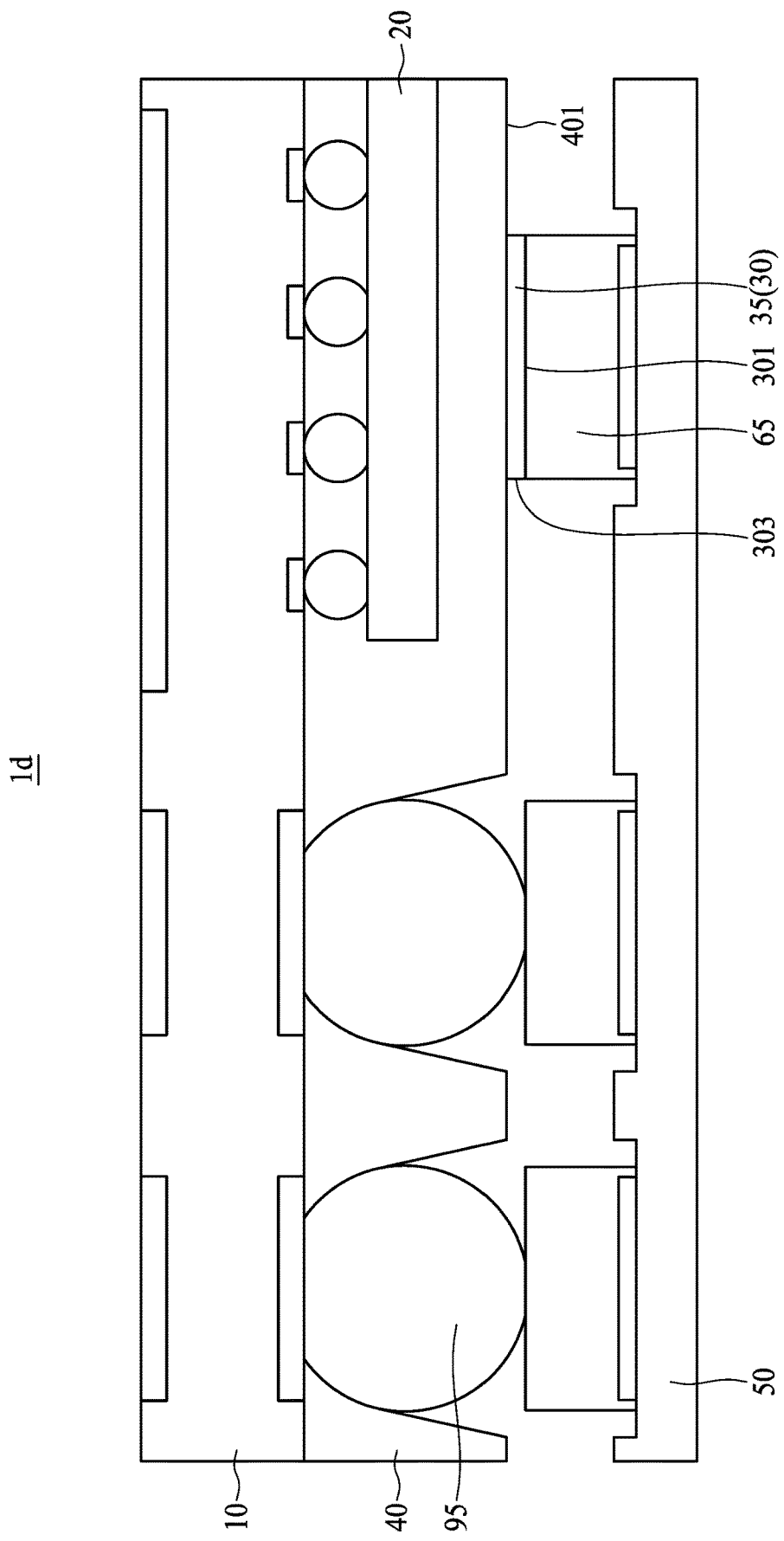
FIG. 1D illustrates a cross-sectional view of a portion of an electrical device in accordance with some embodiments of the present disclosure.
Figure 1D:
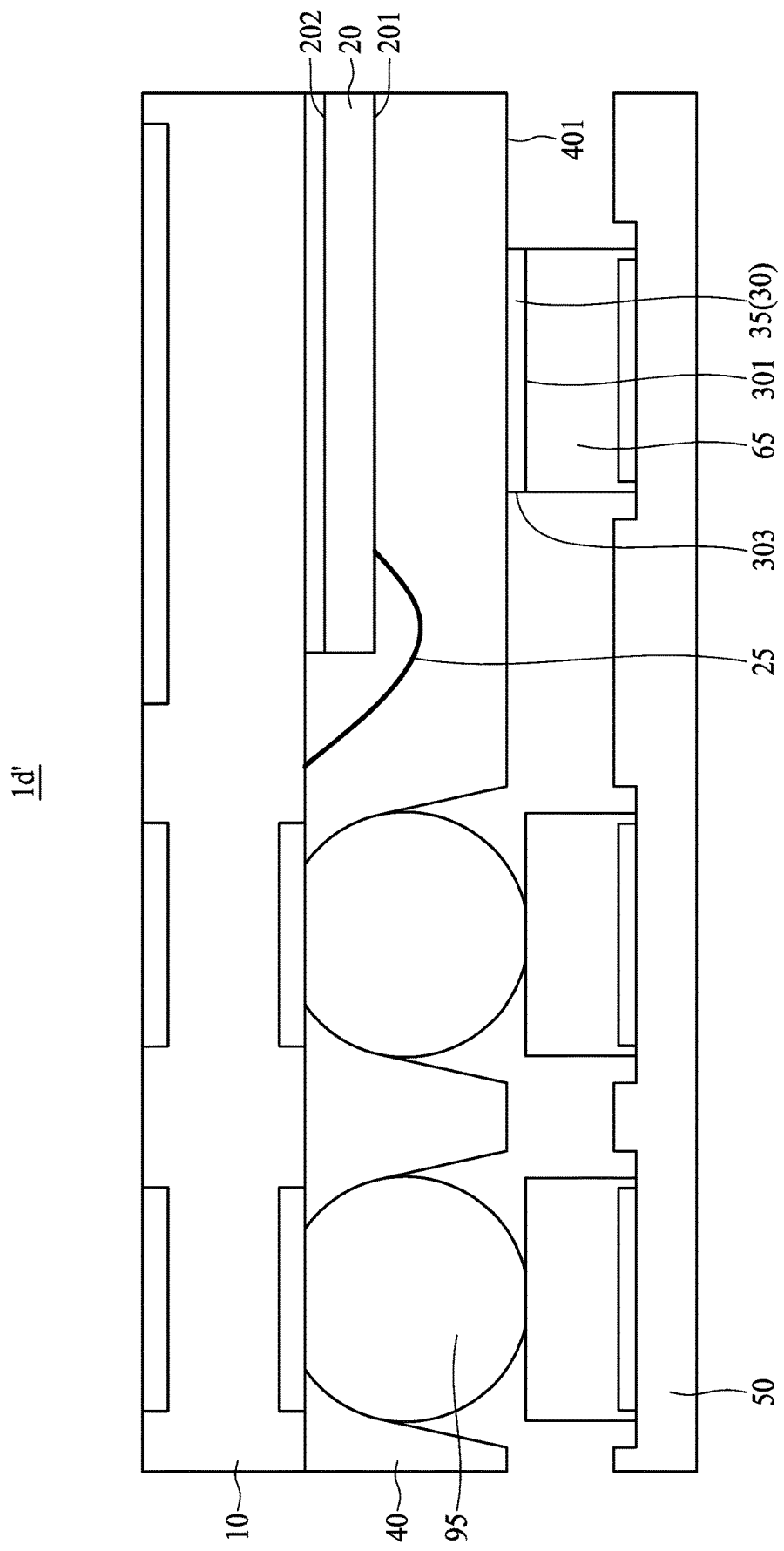

FIG. 1D illustrates a cross-sectional view of a portion of an electrical device 1d in accordance with some embodiments of the present disclosure. The electrical device 1d may be the same as or similar to the electrical device 1b in FIG. 1B with some differences described below.

The portion 35 of the thermal conductive layer 30 is disposed on a surface 401 of the encapsulant 40 and is spaced apart from the electronic component 20 by a portion of the encapsulant 40. The lateral surface 303 and the surface 301 of the portion 35 of the conductive layer 30 are exposed from the encapsulant 40. The conductive material 60 of the electrical device 1b in FIG. 1B is omitted in FIG. 1D. The connection element 65 is in contact with the surface 301 of the conductive layer 30. In some embodiments, the connection element 65 may be in contact with or cover the lateral surface 303 of the conductive layer 30. In some embodiments, a portion 35 of the thermal conductive layer 30 may include epoxy, which may improve the adhesion between the portion 35 and the encapsulant 40 which may also include epoxy.

FIG. 1D' illustrates a cross-sectional view of a portion of an electrical device 1d' in accordance with some embodiments of the present disclosure. The electrical device 1d' may be the same as or similar to the electrical device 1d in FIG. 1D with some differences described below.

A wire 25 is disposed to electrically connect the electronic component 20 to the substrate 10. In the embodiment shown in FIG. 1D', the surface 201 of the electronic component 20 may be an active surface and the surface 202 of the electronic component 20 may be a backside surface. The electronic component 20 may be mounted on the substrate 10 by a die attach film (DAF).

Figure 1E:
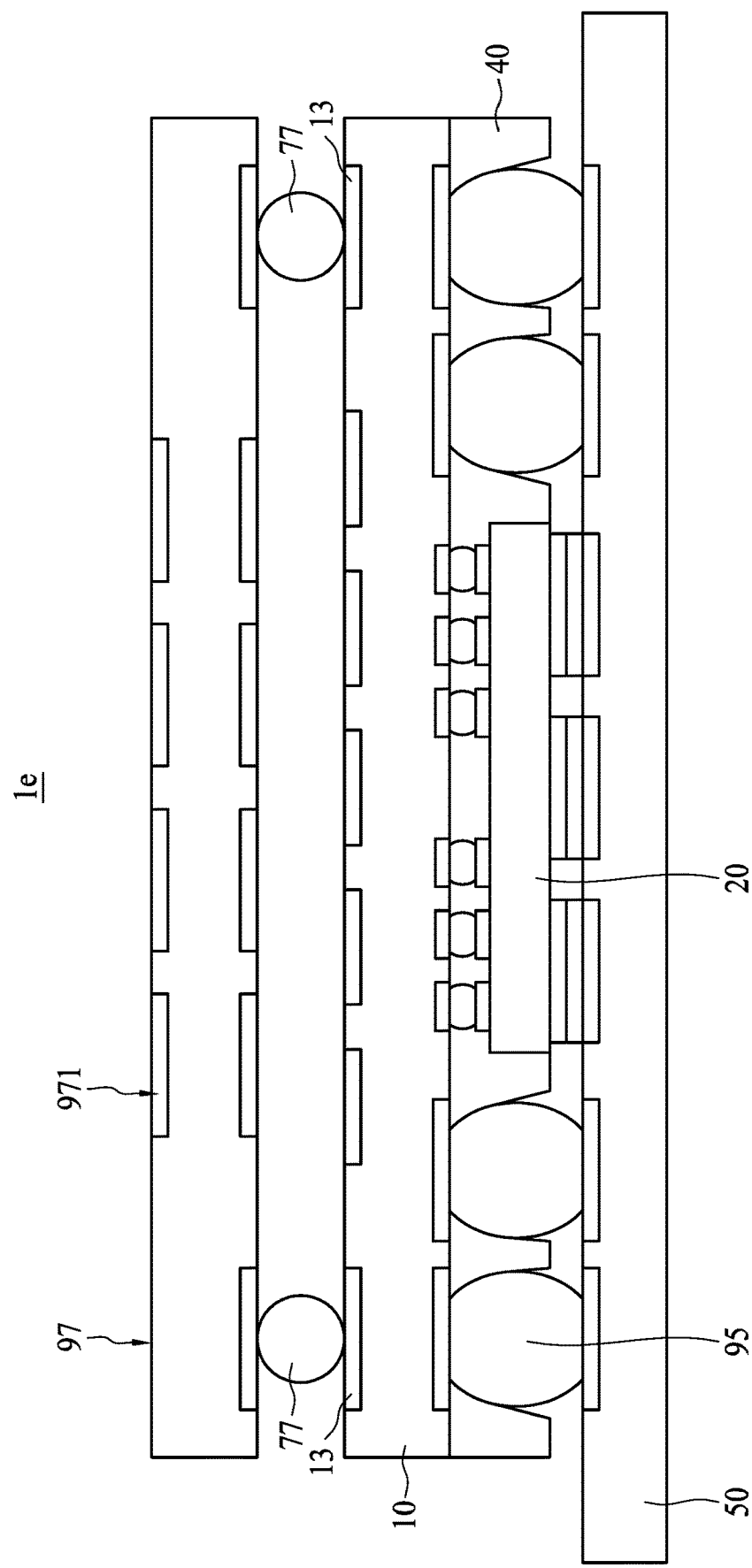
FIG. 1E illustrates a cross-sectional view of an electrical device in accordance with some embodiments of the present disclosure.

FIG. 1E illustrates a cross-sectional view of an electrical device 1e in accordance with some embodiments of the present disclosure. The electrical device 1e is similar to the electrical device 1a in FIG. 1A with some differences described below.

The electronic components 70 and 75, the encapsulant 80 and the antenna device 90 are omitted. An antenna device 97 is disposed on pads 13 of the substrate 10 by connection elements 77. The antenna device 97 includes an antenna pattern 971. The connection elements 77 may have similar or the same properties as the connection elements 95.

Figure 1F:
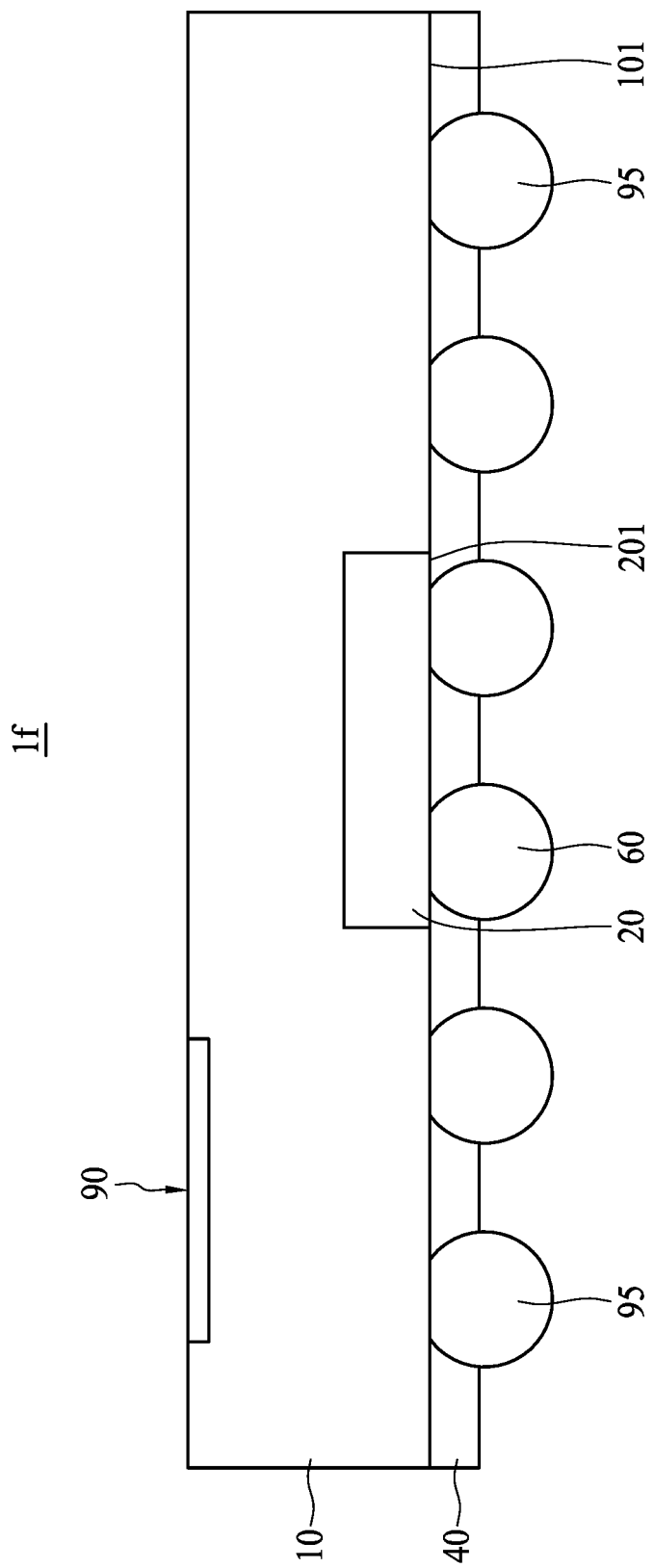
FIG. 1F illustrates a cross-sectional view of an exemplary configuration of a portion of a semiconductor package device in accordance with some embodiments of the present disclosure.

FIG. 1F illustrates a cross-sectional view of an exemplary configuration of a portion of a semiconductor package device 1f in accordance with some embodiments of the present disclosure. The semiconductor package device 1f may have similar features as the structure in FIG. 1B with the main board 50 omitted, with some differences described below.

FIG. 1F illustrates that the electronic component 20 may be embedded in the substrate 10, and a surface 201 of the electronic component 20 is coplanar with a surface 101 of the substrate 10. The connection elements 95 and the thermal conductive material 60 are aligned in the same plane. In some embodiments, the connection elements 95 and the thermal conductive material 60 may have the same or similar sizes and/or material.

Figure 1G:
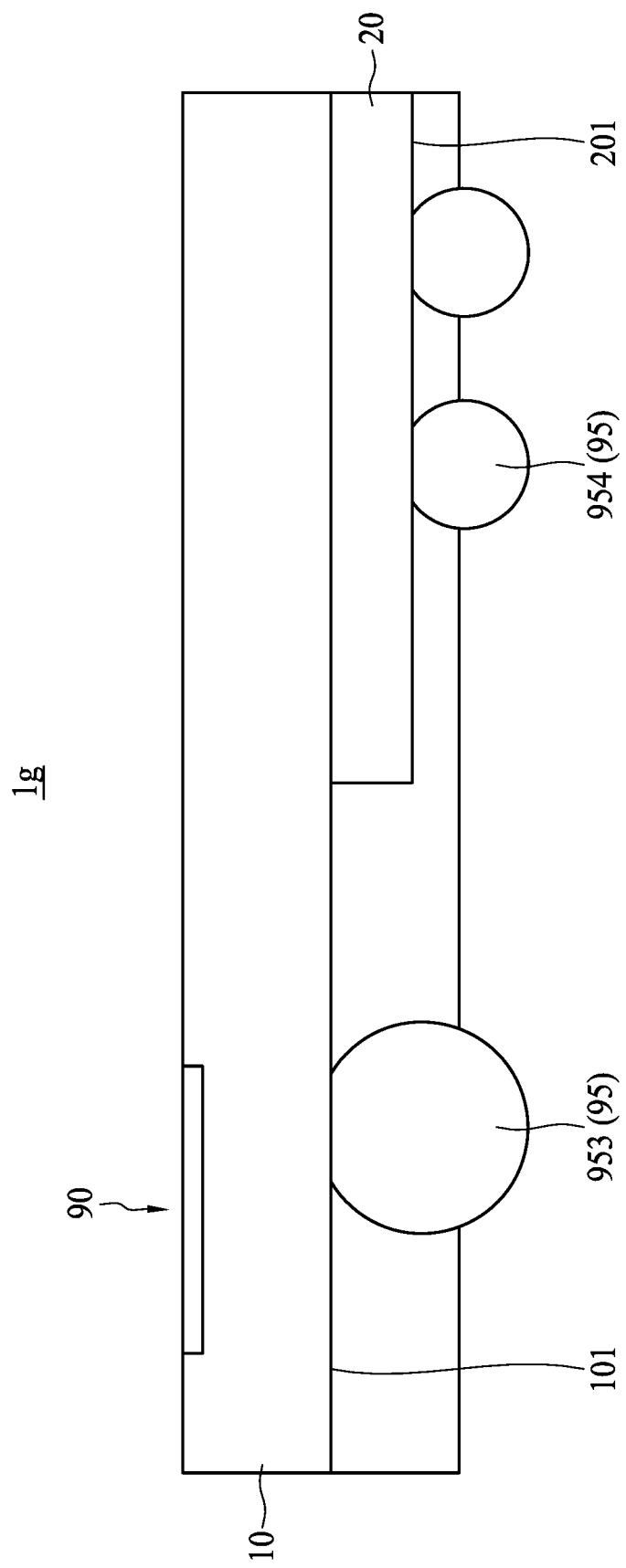
FIG. 1G illustrates a cross-sectional view of an exemplary configuration of a portion of a semiconductor package device in accordance with some embodiments of the present disclosure.

FIG. 1G illustrates a cross-sectional view of an exemplary configuration of a portion of a semiconductor package device 1g in accordance with some embodiments of the present disclosure. The semiconductor package device 1g may have similar features as the structure in FIG. 1B with the main board 50 omitted, with some differences described below.

The connection elements 95 include a connection element 953 disposed on a surface 101 of the substrate 10 and a connection element 954 disposed on a surface 201 of the electronic component 20. As illustrated in FIG. 1G, the connection element 953 and the connection element 954 may have different sizes. However, an end of the connection element 953 facing away from the substrate 10 may be coplanar with an end of the connection element 954 facing away from the substrate 10.

FIG. 2A, FIG. 2B, FIG. 2C, FIG. 2D, FIG. 2E, FIG. 2F, FIG. 2G, FIG. 2H and FIG. 2I are cross-sectional views of an electrical device 2i fabricated at various stages, in accordance with some embodiments of the present disclosure. Various figures have been simplified for a better understanding of the aspects of the present disclosure.

Figure 2A:
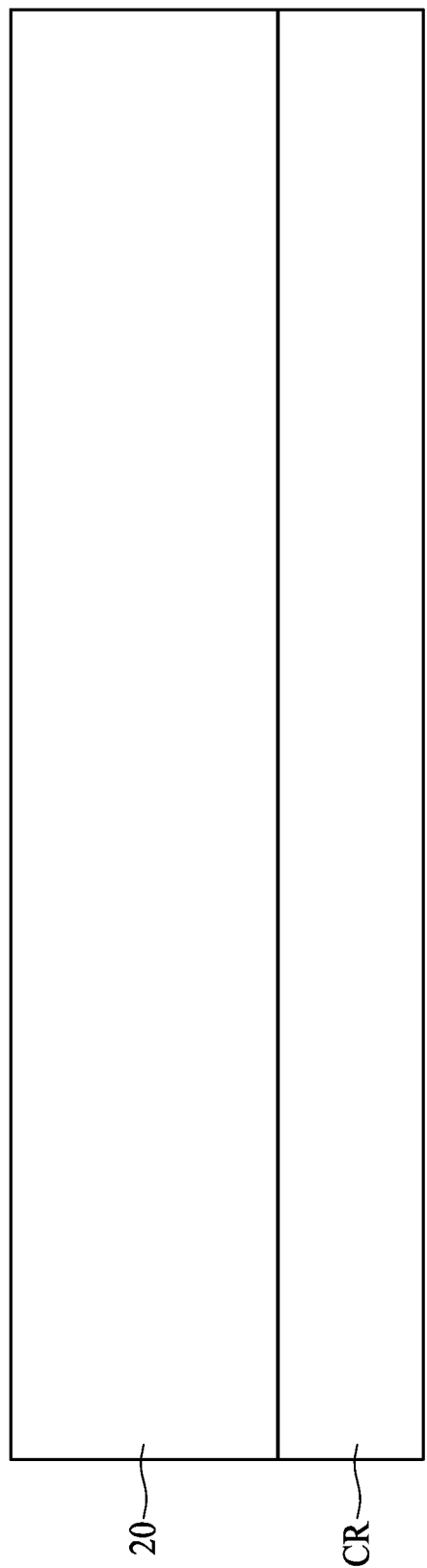
FIG. 2A, FIG. 2B, FIG. 2C, FIG. 2D, FIG. 2E, FIG. 2F, FIG. 2G, FIG. 2H and FIG. 2I are cross-sectional views of an electrical device fabricated at various stages, in accordance with some embodiments of the present disclosure.
Figure 2B:
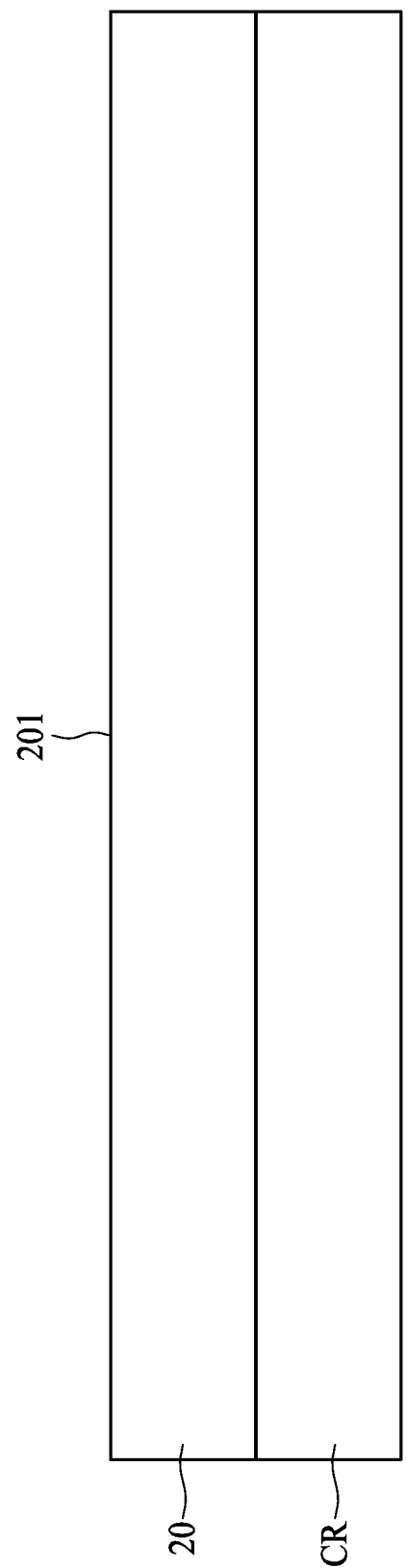

Referring to FIG. 2A, an electronic component 20 is mounted on a carrier CR. The carrier CR may include glass or other materials. Referring to FIG. 2B, a portion of the electronic component 20 is removed to define a surface 201, which may be an inactive surface or a passive surface.

Figure 2C:
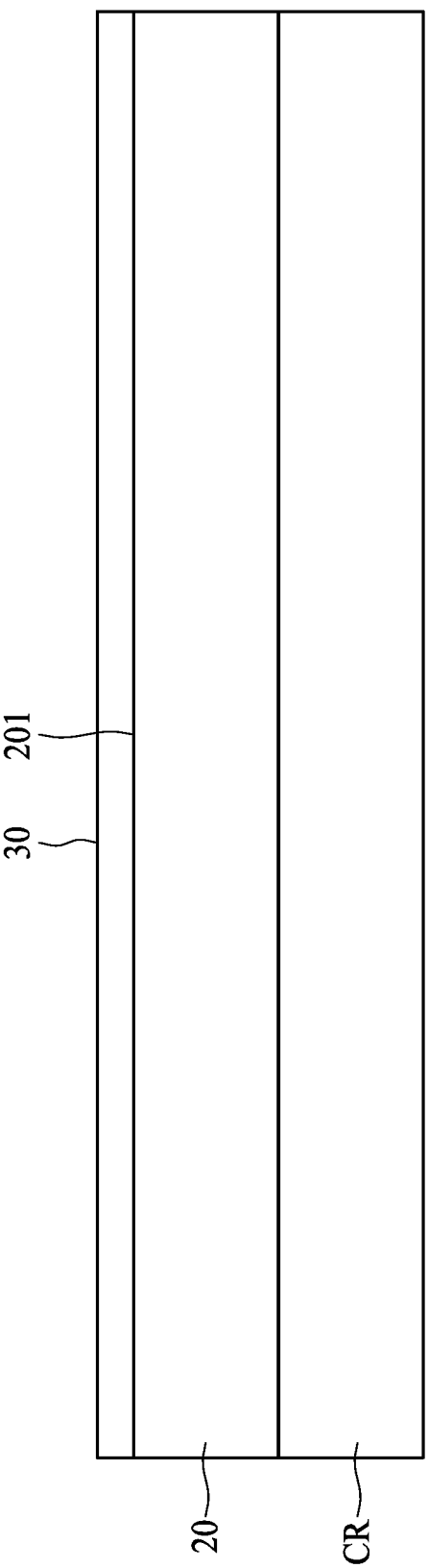
Figure 2D:
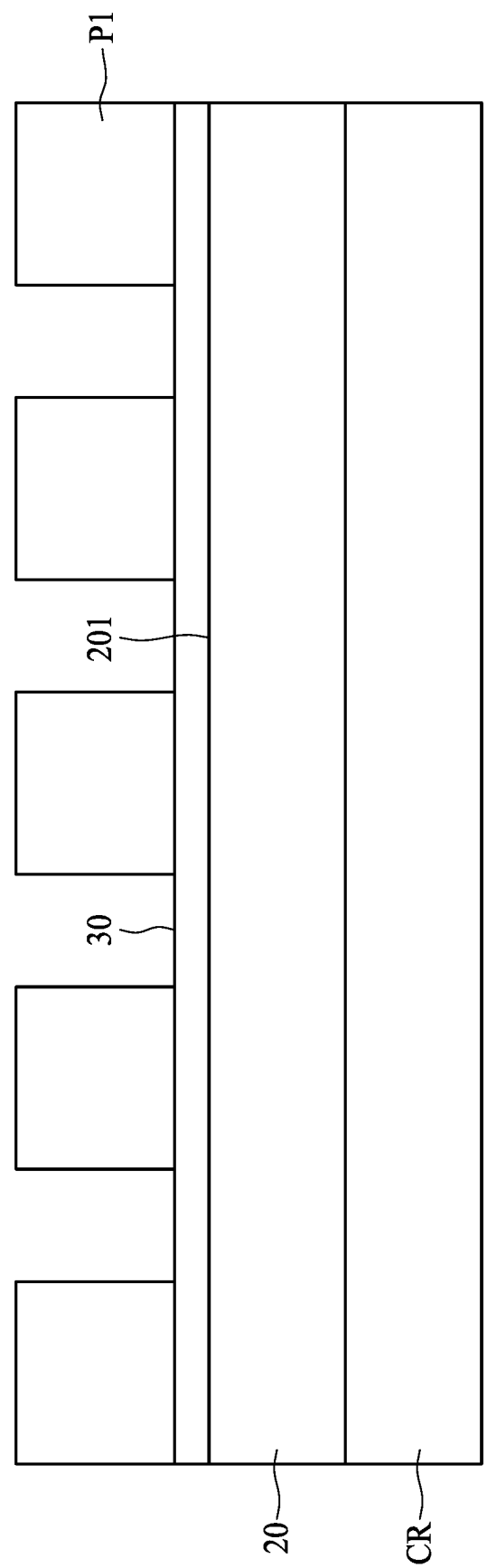

Referring to FIG. 2C, a thermal conductive layer 30 is disposed on the surface 201 of the electronic component 20, wherein operations such as physical vapor deposition (PVD), lamination, plating, screen printing and/or curing may be performed. Referring to FIG. 2D, a patterned photoresist layer P1 is formed on the thermal conductive layer 30, wherein a coating operation, a lithographic operation and/or a developing operation may be performed. A portion of the thermal conductive layer 30 is exposed from the patterned photoresist layer P1.

Figure 2E:
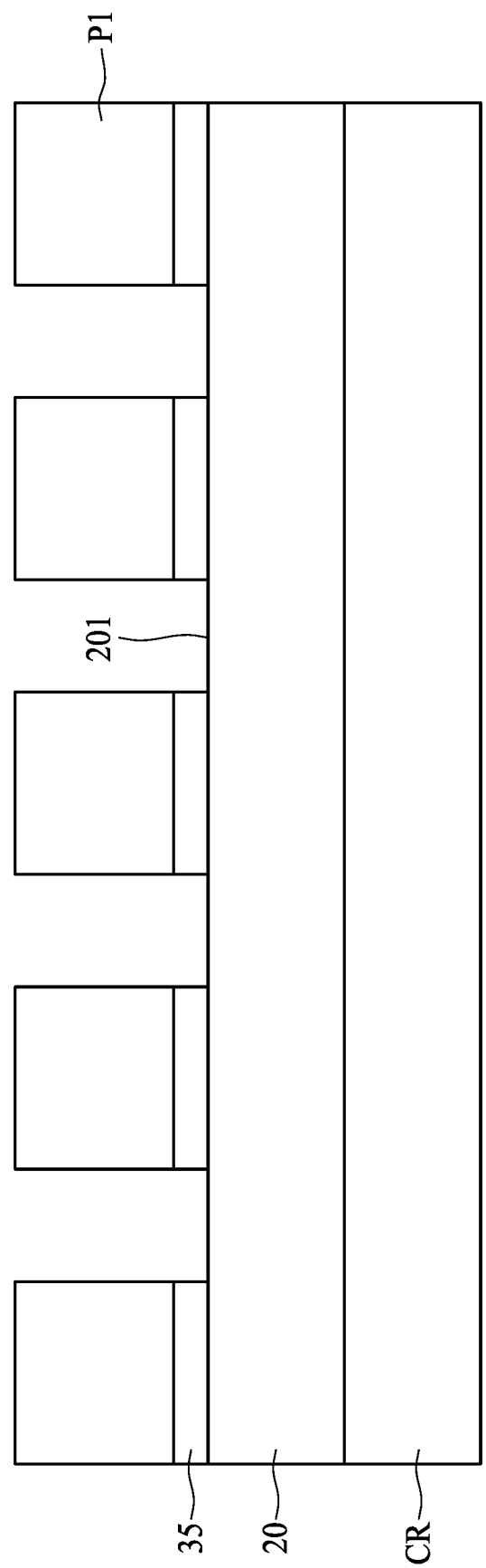
Figure 2F:
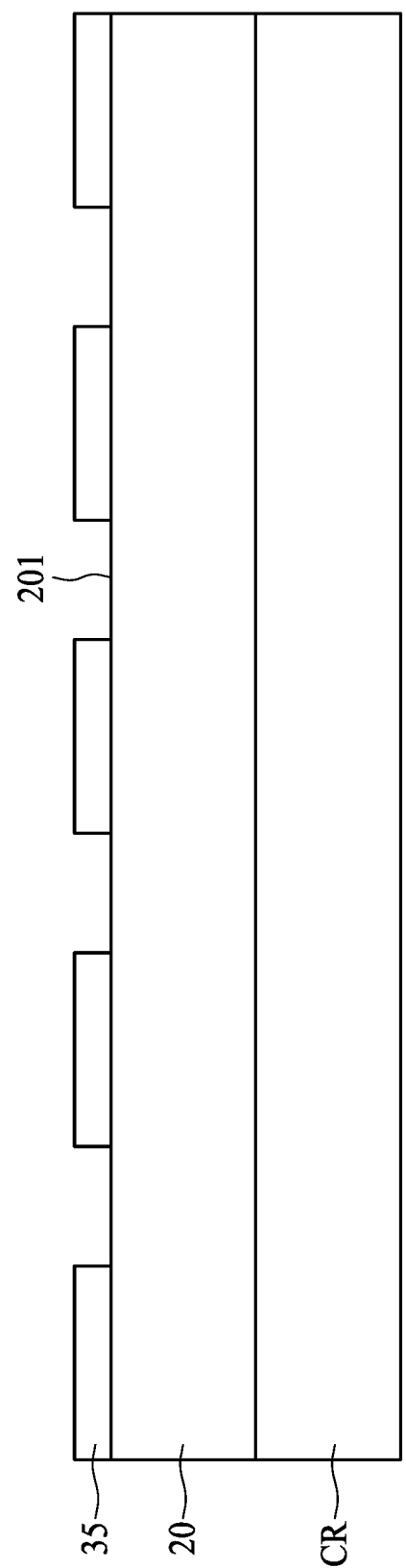

Referring to FIG. 2E, the exposed portion of the thermal conductive layer 30 is removed, wherein an etching operation may be performed. A plurality of partitioned or separate portions 35 of the thermal conductive layer are formed. A portion of the surface 201 of the electronic component 20 is exposed. Referring to FIG. 2F, the patterned photoresist layer P1 is removed, wherein an etching operation may be performed.

Figure 2G:
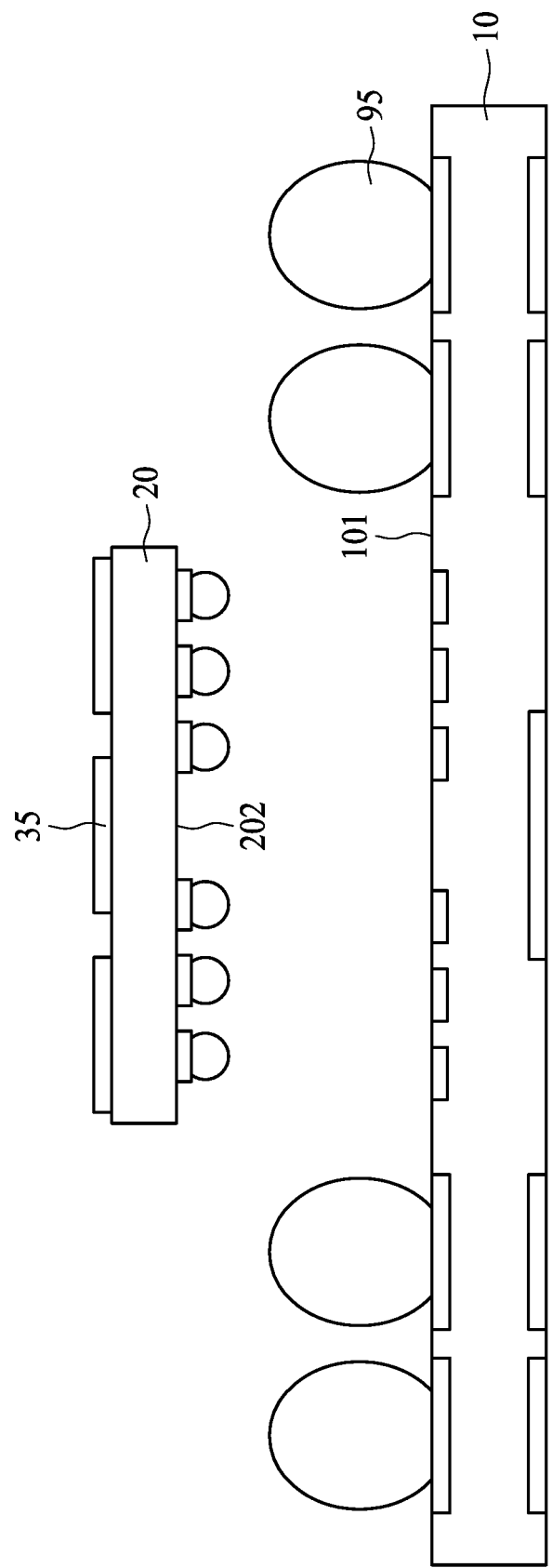

Referring to FIG. 2G, the carrier CR is removed to expose a surface 202 of the electronic component 20. The surface 202 of the electronic component 20 may be an active surface with circuits thereon. The electronic component 20 is mounted on a surface 101 of a substrate 10. Connection elements 95 are mounted on the surface 101 of the substrate 10, wherein a ball mount operation may be performed.

Figure 2H:
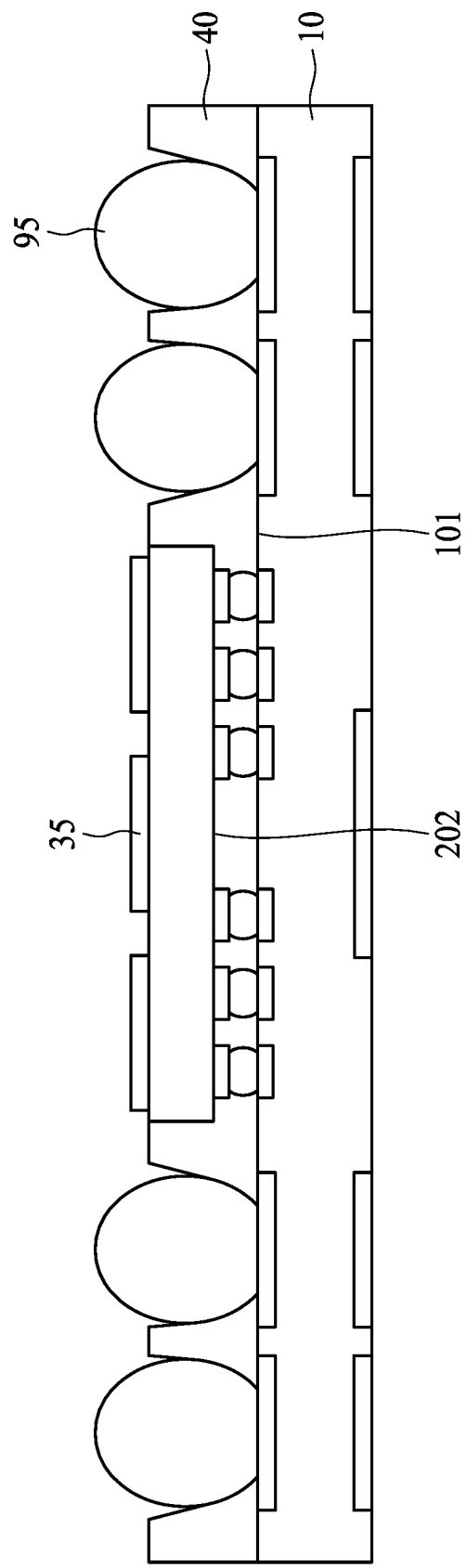

Referring to FIG. 2H, an encapsulant 40 is formed on the surface 101 of the substrate 10, wherein a molding operation may be performed. The encapsulant 40 surrounds the electronic component 20 and the connection elements 95, and exposes the surface 201 of the electronic component 20, the portions 35 of the thermal conductive layer 30, and a portion of each connection element 95.

Figure 2I:
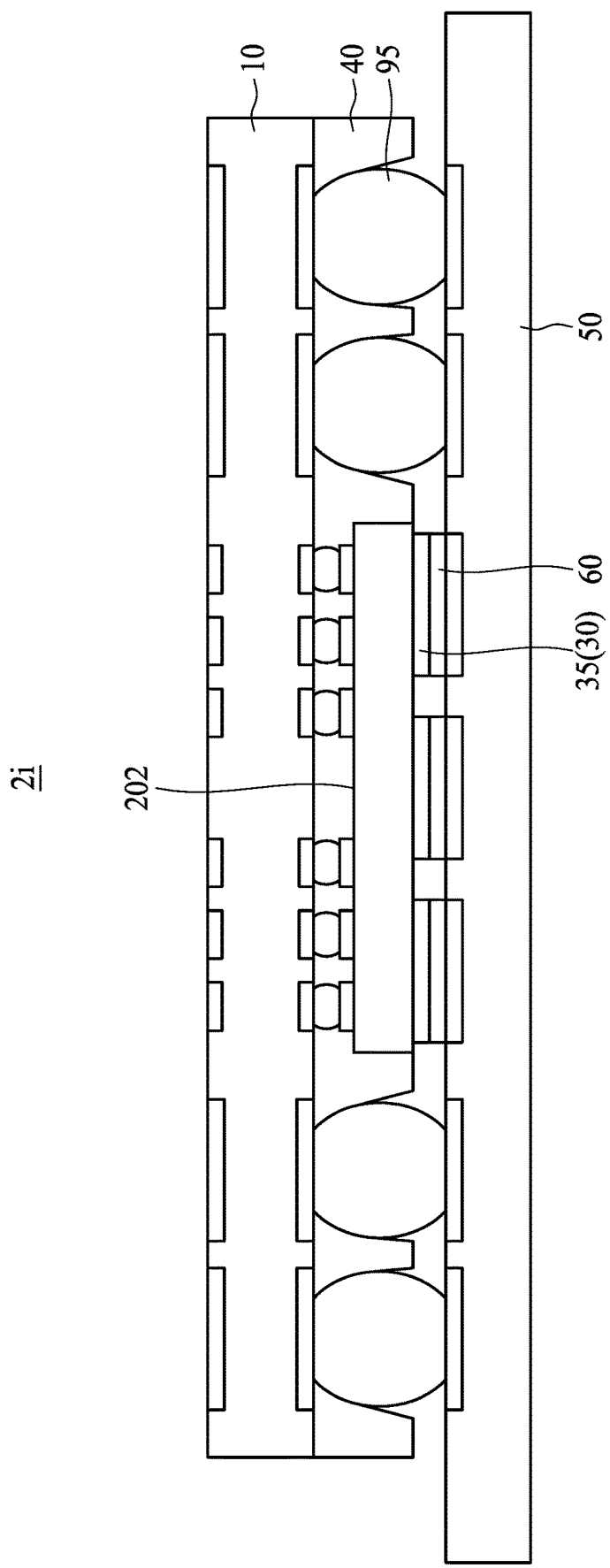

Referring to FIG. 2I, a main board 50 is provided. The structure in FIG. 2H is mounted on the main board 50. The portions 35 of the thermal conductive layer 30 are connected to the main board 50 by a plurality of partitioned or separate thermal conductive materials 60, which may be flowable during a reflow operation. Since the surface 201 of the electronic component 20 may be an inactive or passive surface, the thermal conductive materials 60 may form a non-signal transmission region wherein no signal transmission (e.g., between the electronic component 20 and the main board 50) may occur. The connection elements 95 are mounted on the main board 50, and may be mounted concurrently as the portions 35 of the thermal conductive layer 30 are mounted on the main board 50. The electrical device 2i may be similar to or the same as the electrical device 1a in FIG. 1A, with the electronic components 70 and 75, the antenna device 90 and the encapsulant 80 omitted.

FIG. 3A, FIG. 3B, FIG. 3C, FIG. 3D and FIG. 3E are cross-sectional views of a semiconductor package device 3e fabricated at various stages, in accordance with some embodiments of the present disclosure. Various figures have been simplified for a better understanding of the aspects of the present disclosure.

Figure 3A:
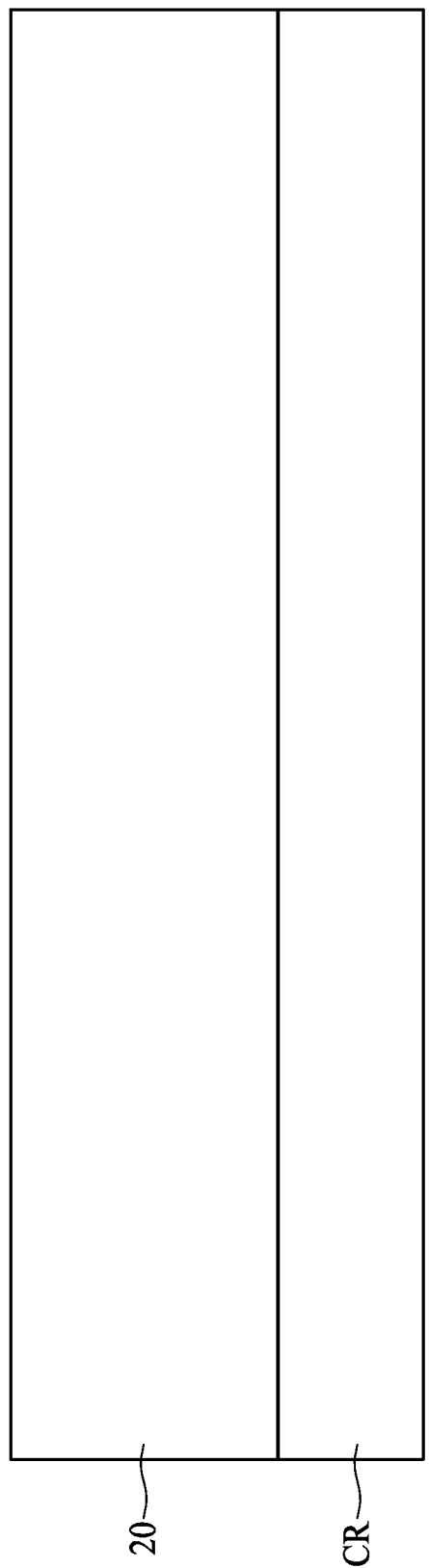
FIG. 3A, FIG. 3B, FIG. 3C, FIG. 3D and FIG. 3E are cross-sectional views of a semiconductor package device fabricated at various stages, in accordance with some embodiments of the present disclosure.
Figure 3B:
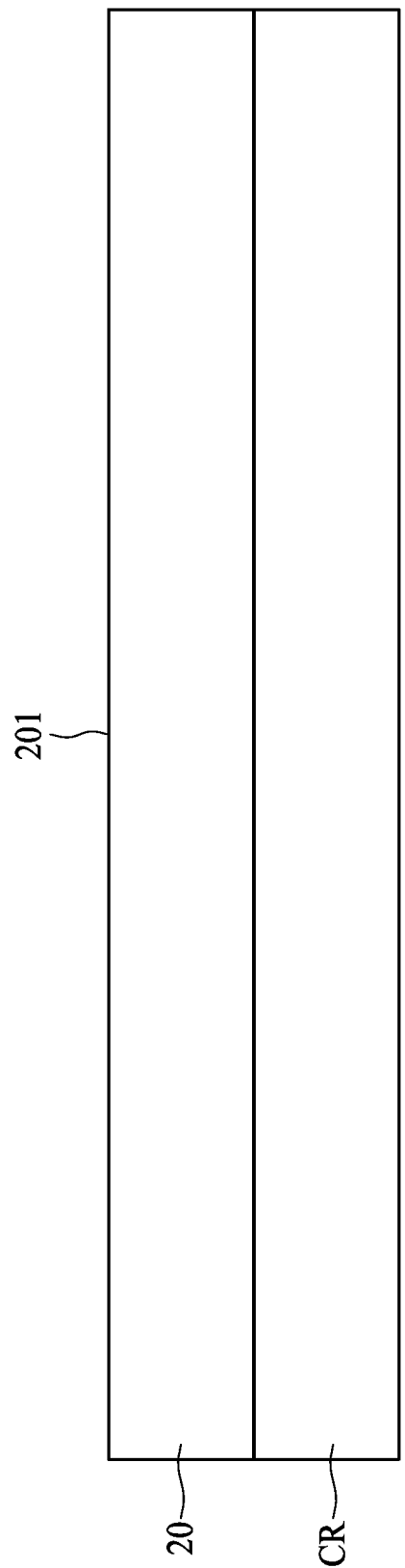

Referring to FIG. 3A, an electronic component 20 is mounted on a carrier CR. The carrier CR may include glass or other materials. Referring to FIG. 3B, a portion of the electronic component 20 is removed to define a surface 201, which may be an inactive surface or a passive surface.

Figure 3C:
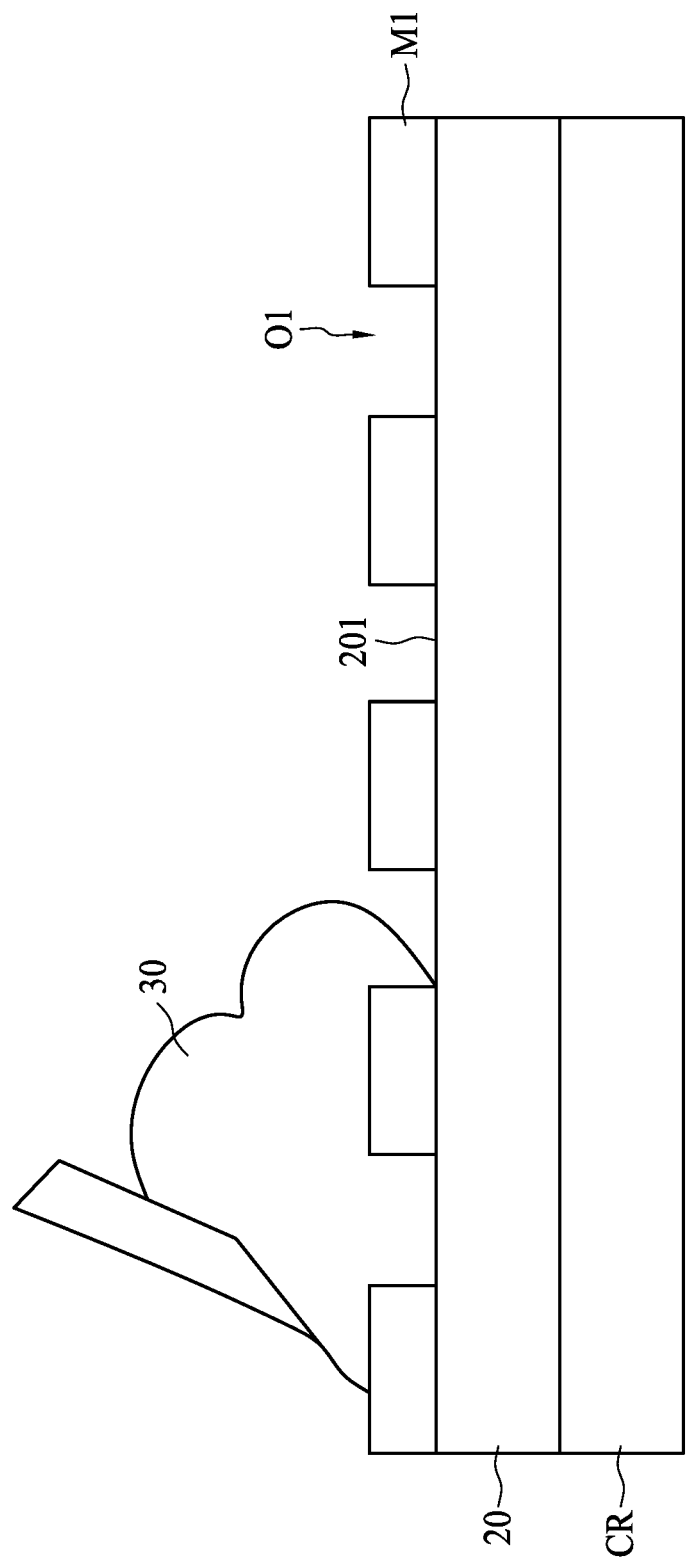
Figure 3D:
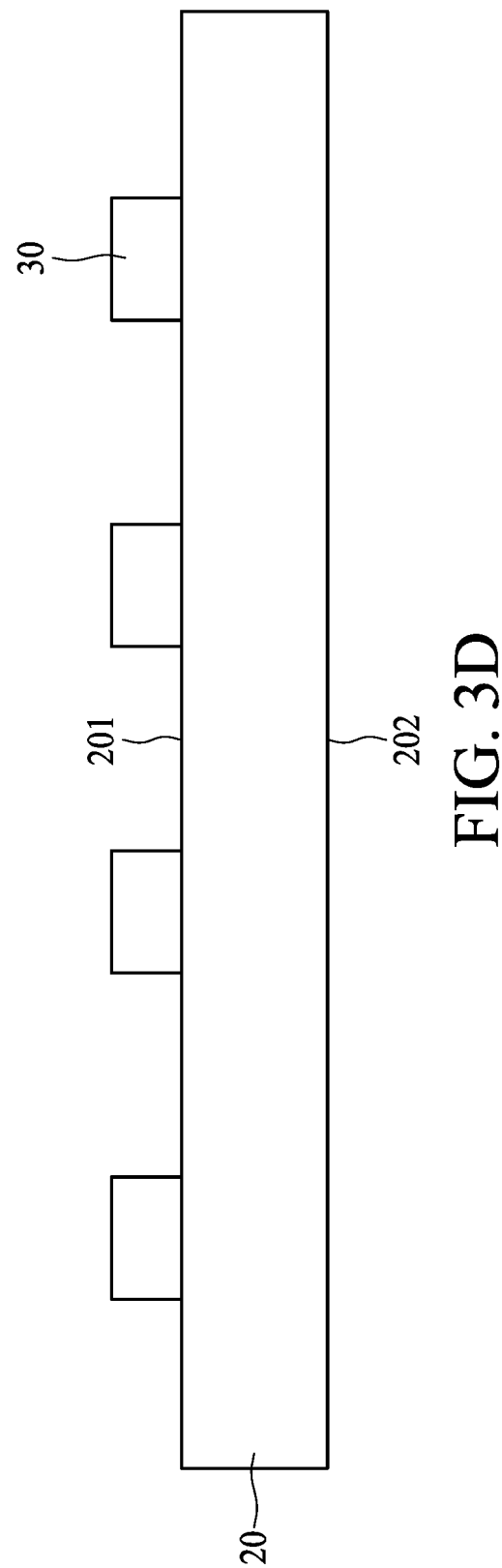

Referring to FIG. 3C, a mask (or a stencil) M1 with a plurality of openings O1 is provided on the surface 201 of the electronic component 20. A thermal conductive layer 30 is printed or screened on the surface 201 of the electronic component 20 through the mask M1. Referring to FIG. 3D, the carrier CR is removed to expose a surface 202 of the electronic component 20. The surface 202 of the electronic component 20 may be an active surface with circuits thereon. A curing operation may be performed to cure the thermal conductive layer 30.

Figure 3E:
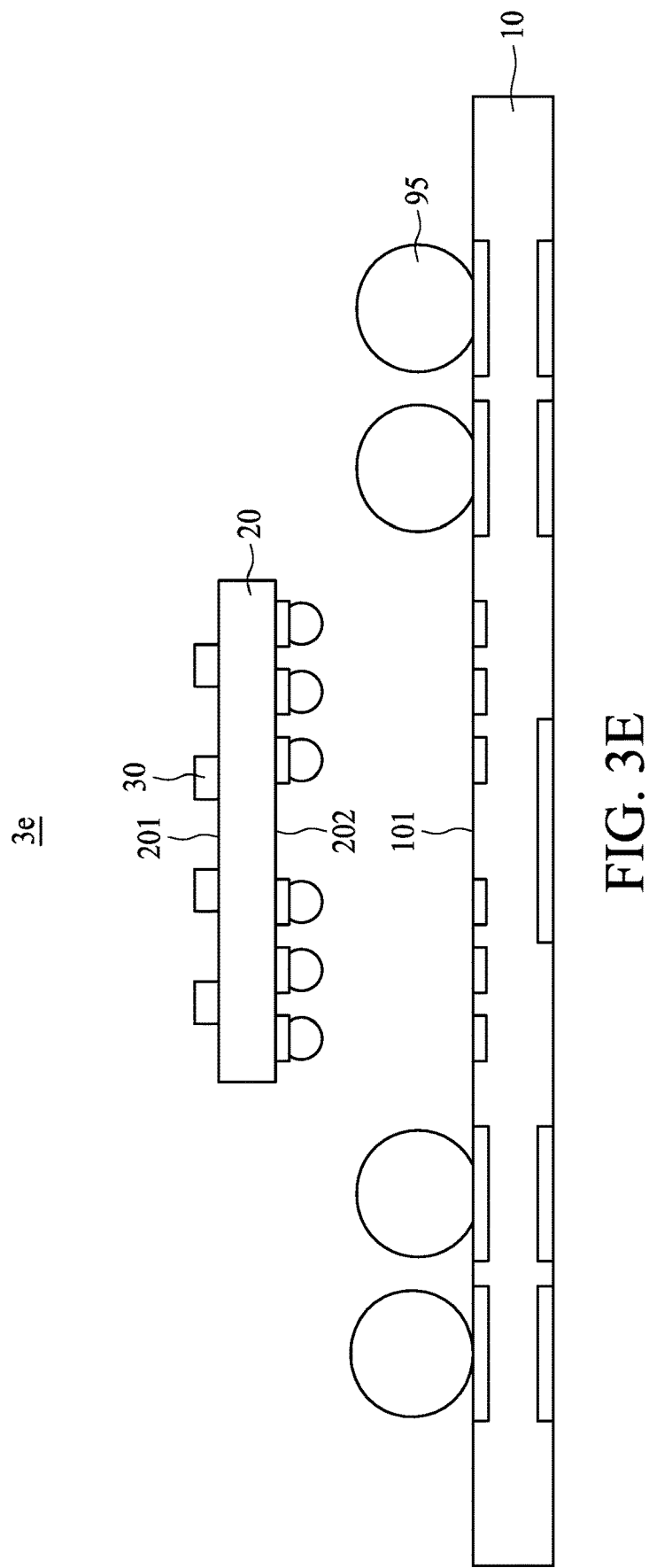

Referring to FIG. 3E, the electronic component 20 is mounted on a surface 101 of a substrate 10. Connection elements 95 are mounted on the surface 101 of the substrate 10, wherein a ball mount operation may be performed. The semiconductor package device 3e is formed. The semiconductor package device 3e may be similar to the structure in FIG. 2G.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
    a substrate;
    a first electronic component disposed on the substrate, the first electronic component comprising a first surface facing away from the substrate; and
    a thermal conductive layer disposed above the first surface of the first electronic component;
    a first encapsulant covering the substrate and the first electronic component;
    a second electronic component, wherein the substrate has a first surface and a second surface opposite to the first surface, the first electronic component is disposed on the first surface of the substrate, and the second electronic component is disposed on the second surface of the substrate; and
    a plurality of connection elements disposed on the first surface of the substrate and surrounding the thermal conductive layer,
    wherein the thermal conductive layer comprises a plurality of portions spaced apart from each other.

2. The semiconductor package device of claim 1, wherein the thermal conductive layer contacts the first surface of the first electronic component.

3. The semiconductor package device of claim 2, wherein the first surface of the first electronic component is a passive surface.

4. The semiconductor package device of claim 1, wherein the thermal conductive layer comprises an epoxy and a thermal conductive filler.

5. The semiconductor package device of claim 1, wherein the portions of the thermal conductive layer are insulated from each other.

6. The semiconductor package device of claim 1, wherein a lateral surface of the thermal conductive layer is exposed from the first encapsulant.

7. The semiconductor package device of claim 1, further comprising:
    a second encapsulant disposed on the second surface of the substrate and encapsulating the second electronic component.

8. The semiconductor package device of claim 1, wherein an active surface of the first electronic component faces an active surface of the second electronic component.

9. The semiconductor package device of claim 1, further comprising:
    an antenna device disposed on the second surface of the substrate.

10. The semiconductor package device of claim 9, wherein the antenna device comprises an antenna pattern formed on the second surface of the substrate.

11. The semiconductor package device of claim 1, wherein each of the plurality of portions of the thermal conductive layer comprises a plurality of laminated layers.

12. The semiconductor package device of claim 1, wherein a portion of the first encapsulant is disposed between the first electronic component and the substrate.

13. The semiconductor package device of claim 1, wherein the first surface of the first electronic component is substantially coplanar with a surface of the first encapsulant.

14. The semiconductor package device of claim 13, wherein there is a gap between the surface of the first encapsulant and each of the plurality of connection elements.

15. The semiconductor package device of claim 6, wherein there is a distance between the lateral surface of the thermal conductive layer and a second surface of the first electronic component, and the second surface of the first electronic component is substantially perpendicular to the first surface of the first electronic component.

16. The semiconductor package device of claim 7, wherein a portion of the second encapsulant is disposed between the first electronic component and the second electronic component.

17. The semiconductor package device of claim 1, further comprising: a passive device disposed on the second surface of the substrate.

* * * * *